(12) United States Patent
Jansen et al.

(10) Patent No.: US 6,385,550 B1
(45) Date of Patent: May 7, 2002

(54) APPARATUS AND METHOD FOR PROVIDING FORWARD AND BACKWARD COMPATIBILITY BETWEEN A HOST INSTRUMENT AND AN ACCESSORY

(75) Inventors: Philip K. Jansen, Portland; Erik J. Johnson, Beaverton, both of OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/333,116

(22) Filed: Jun. 14, 1999

Related U.S. Application Data
(60) Provisional application No. 60/089,362, filed on Jun. 15, 1998.

(51) Int. Cl.[7] .............................................. G06F 19/00
(52) U.S. Cl. .......................... 702/91; 324/72.5; 324/115; 702/66; 702/117; 702/119
(58) Field of Search ............................. 702/66, 91, 117, 702/119; 324/72.5, 115

(56) References Cited

U.S. PATENT DOCUMENTS

| | | | |
|---|---|---|---|
| 4,672,306 A | * 6/1987 | Thong ........................ | 324/72.5 |
| 5,162,725 A | * 11/1992 | Hodson et al. ............. | 324/115 |
| 5,691,635 A | * 11/1997 | Pot et al. .................... | 324/115 |
| 5,939,875 A | * 8/1999 | Fleps et al. ................. | 324/115 |
| 6,232,764 B1 | * 5/2001 | Rettig et al. ................ | 324/115 |

\* cited by examiner

*Primary Examiner*—Arthur T. Grimley
*Assistant Examiner*—John Le
(74) *Attorney, Agent, or Firm*—Thomas F. Lenihan

(57) ABSTRACT

A probe or accessory incorporating the features of the subject invention includes a communications arrangement for communicating topology-related data to a host instrument connected to the probe or accessory. The topology-related data describes the probe or accessory as a network comprising multiple paths from the probe tip to host instrument input connector. Each path is associated with a feature of the probe or accessory, and only one path may be active at any given time. Each feature is described by a unique number, called a "tag". New tags may be assigned when necessary so long as existing tags are not disturbed. A probe or accessory in accordance with the subject invention transmits a list of "Required Tags" to the host instrument. Each required tag is associated with a pathway within the probe or accessory. The host instrument may only exercise those paths for which all required tags are understood, or those for which no required tag is designated. Tags which are not understood by the host instrument, but which also do not appear in the required tags list, are to be ignored by the host instrument.

4 Claims, 6 Drawing Sheets

US 6,385,550 B1

APPARATUS AND METHOD FOR PROVIDING FORWARD AND BACKWARD COMPATIBILITY BETWEEN A HOST INSTRUMENT AND AN ACCESSORY

CLAIM FOR PRIORITY

The subject application is a continuation of U.S. Provisional Patent Application Serial No. 60/089,362 filed Jun. 15, 1998.

FIELD OF THE INVENTION

The subject invention generally concerns the field of electronic instruments and accessories therefor. The subject invention specifically addresses the problem of providing forward and backward compatibility between these instruments and devices.

BACKGROUND OF THE INVENTION

The first oscilloscope probes simply conveyed the signal at the tip to the oscilloscope connected to the probe. No additional features were provided. In the early 1970's, the 7000-series oscilloscope probe was introduced by Tektronix, Inc. of Beaverton, Oreg. In addition to conveying the voltage at it's tip to the host oscilloscope, this probe provided two additional capabilities, channel identification and scale factor indication. The scale factor indicator feature is implemented by applying an analog encoded through a resistor of a predetermined value to a slip ring in the probe. The instrument senses the voltage on the slip ring and adjusts the vertical sensitivity accordingly to automatically accommodate 1x, 10x, or 100x probes. The channel identification feature temporarily grounds the slip ring through a momentary switch mounted on the probe and operated by the user. Probes incorporating these features are said to exhibit level 1 capability.

The next generation of probes, introduced by Tektronix, Inc. in 1986, accompanied the 11,000-series oscilloscopes. These probes included a power hook-up through the connector. They also included an accessory offset hook-up through the connector with calibrated offset operation at the accessory input. A serialized, expandable I²C coding capability for communication through the connector to indicate function, scale factor, offset, and accessory type was also provided. Probes having these capabilities are said to exhibit level 2 capability. Level 2 capable instruments are also backward compatible with level 1 probes.

It is well known to provide backward compatibility between instruments and older generation probes, as demonstrated by fact that the above-mentioned Level-2 capable 11,000-series oscilloscopes accept and use the Level-17,000 series probes.

Clearly, each new generation of oscilloscopes and probes provides new and ever more useful features for the user. Unfortunately, current generation oscilloscopes will not be able to recognize the codes and provide proper operation for features which did not exist at the time the current oscilloscopes were manufactured. Of course, some software implementable features may be added to current oscilloscopes by downloading new code, but if a new feature requires new hardware, then the current oscilloscope will not be able to exercise the desired function. Moreover, it is foreseeable that if the current oscilloscope receives a command to exercise a function of which it has no knowledge, then a situation may be created in which an attempt to exercise the function may cause damage to the oscilloscope or to the probe. What is needed is a way to establish forward compatibility between currently produced oscilloscopes and next generation of probes and accessories.

SUMMARY OF THE INVENTION

An accessory or a probe for a test and measurement instrument includes an input for receiving a signal and an output coupled to said test and measurement instrument, and at least one signal path for conveying a signal from the input to the output. The accessory or probe also includes a data path for communicating between the test and measurement instrument and the accessory, and a memory unit for storing information about said accessory, the memory unit being coupled to the data path.

The information includes an entry concerning a function that the test and measurement instrument is required to be capable of controlling. The memory unit retrieves that entry under control of the test and measurement instrument and conveys the entry to the test and measurement instrument via the data path for a determination by the test and measurement instrument as to whether or not the test and measurement instrument can control the function.

DETAILED DESCRIPTION OF THE DRAWING

Figure 1:
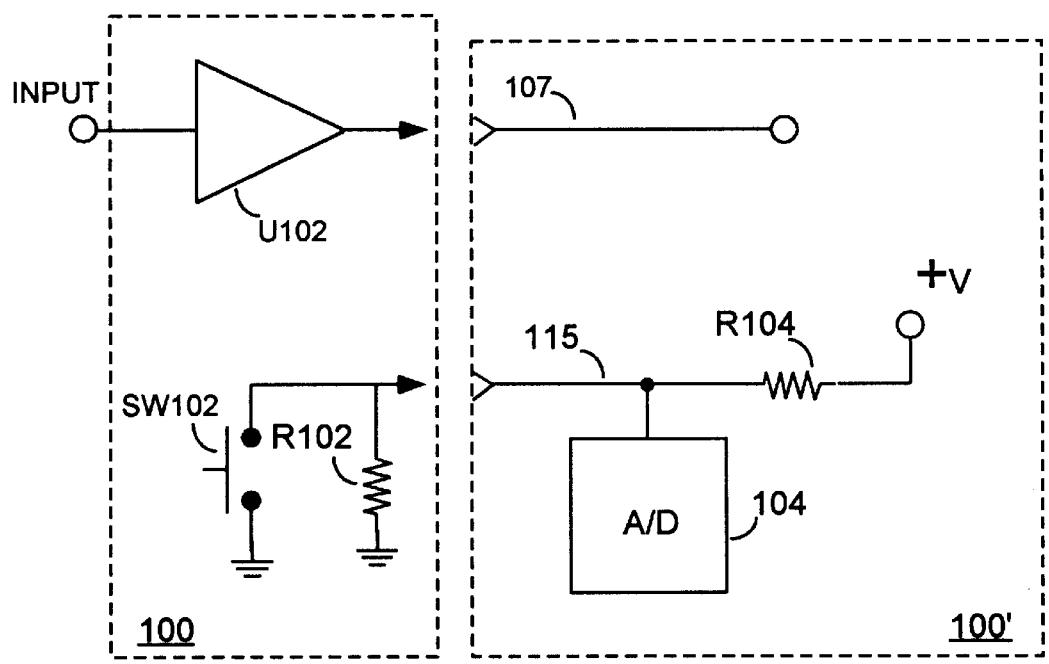
FIG. 1 is a simplified schematic diagram of a Level 1 probe as known from the prior art.

A brief overview of the history leading up to the subject invention may be helpful in understanding the advantages provided by the subject invention. FIG. 1 is a simplified schematic drawing of a Level 1 probe, such as the Tektronix 7000-series probes mentioned above. The probe is generally designated 100, and the oscilloscope to which it is connected is generally designated 100'. The arrangement comprises a signal path from an input through an amplifier U102 to a signal line 107 which is in turn coupled to signal processing circuitry (not shown) within the oscilloscope. Oscilloscope 110' in cooperation with probe 100 also provides an arrangement for determining the scale factor for the probe and for channel identification. One end of a DATA line 115 is coupled to a source of supply voltage through a resistor R104 for biasing DATA line 115 to a predetermined voltage value. Resistor R104 typically exhibits a value of 1000 ohms. An A/D (analog to digital) converter 104 has an input coupled to DATA line 115 for sensing the voltage present on the line. An output of A/D converter 104 may be connected to a microcomputer or other control hardware (not shown). The other end of DATA line 115 terminates at a connector which mates to a Level 1 probe. Probe 100 includes a resistor R102 having a different predetermined value indicative of the scale factor of the probe (i.e., 1×, 10×, 100×). When connected to the oscilloscope, resistor 102 is coupled between DATA line 115 and a point of reference potential (i.e., ground). Depending upon the particular value of resistor r102, a corresponding unique voltage is developed at the input of A/D converter 104 by virtue of the voltage divider formed by resistors R102 and R104. DATA line 115 is also used to convey channel identification information to oscilloscope 100' by momentarily coupling DATA line 115 to ground via a momentary switch SW102. When the user closes SW102, the voltage at the input terminal of A/D 104 goes to zero and the control microprocessor (not shown) causes the signal trace associated with that probe to be displaced vertically on the screen (also not shown).

Figure 2:
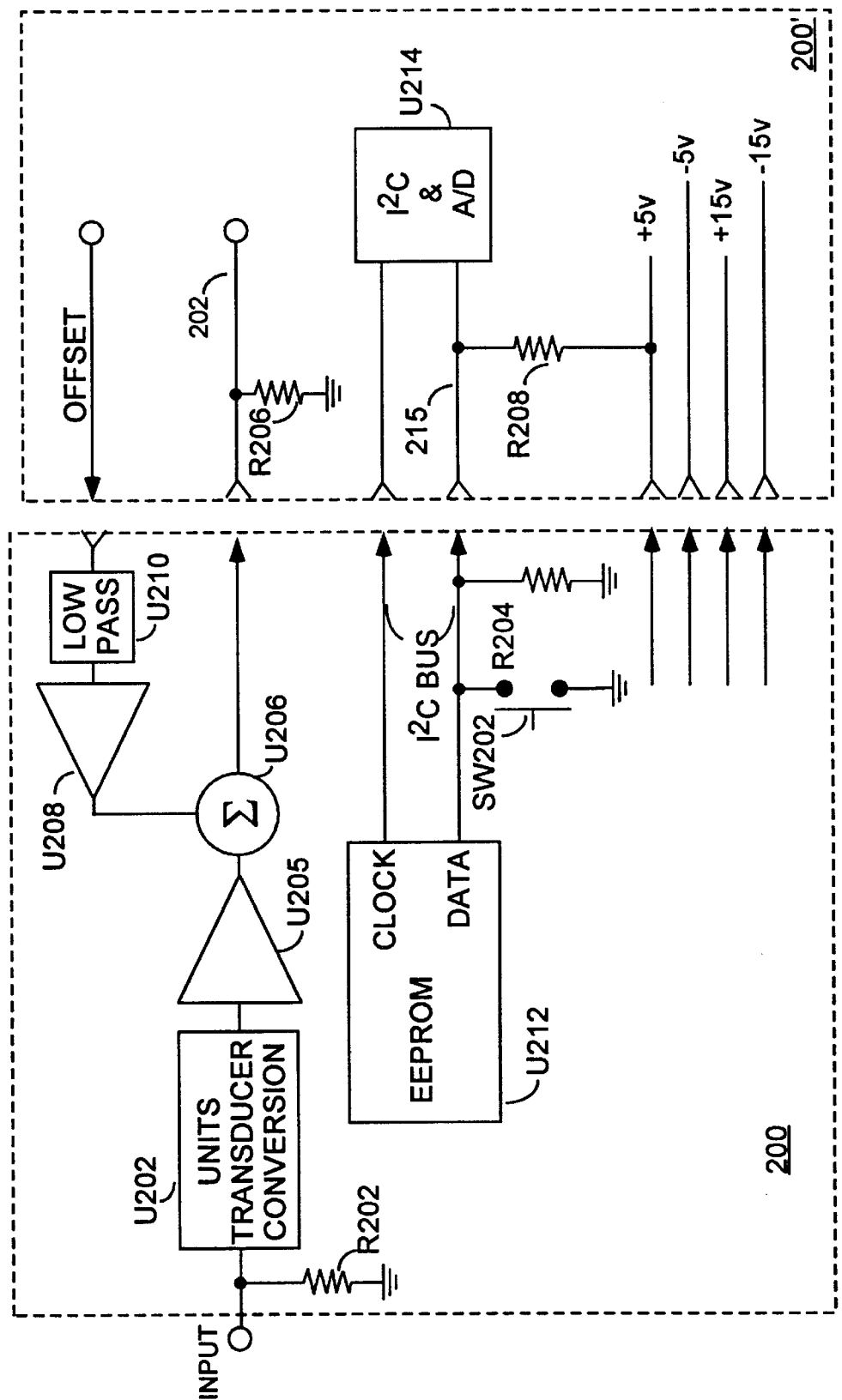
FIG. 2 is a simplified schematic diagram of a Level 2 probe as known from the prior art.

An improvement to Level 1 probes is the Level 2 probe shown in simplified schematic form in FIG. 2. A Level 2 probe 200 had capabilities that allowed more communication between an oscilloscope 200' and the probe. Like the Level 1 probe, there are basically two paths, a signal path 202 and a DATA path 215. Level 2 probes are more sophisticated in both the signal path and in the DATA path. In the signal path, one can see the addition of a UNITS TRANSDUCER CONVERSION circuit U202, a SUMMING circuit U206, and an OFFSET path including an amplifier 208 and a low pass filter 210. The OFFSET path receives an OFFSET signal from oscilloscope 200' to correct any offset that might be present in the signal path of probe 200. The DATA path of a Level 2 probe is embodied in an I²C bus, incorporating a CLOCK line and a DATA line. Probe data is stored in an EEPROM (electrically erasable programmable read only memory) U212. The probe data includes information as to scale factor, input function, offset, and accessory type. Backward compatibility with Level 1 probes was maintained by providing the previously discussed voltage divider on the DATA line 215. Thus, a Level 1 probe coupled to a Level 2 oscilloscope will form the voltage divider on the data line of oscilloscope 200' just as in the case described above with respect to FIG. 1. When a level 2 probe is coupled to a Level 2 oscilloscope, a particular value for resistor R204 causes a unique voltage to be developed at A/D converter 214 which identifies the probe as a Level 2 probe. Note also that the channel identification switch SW202 is present on DATA line 215 and functions as it did in the Level 1 probe.

Figure 3:
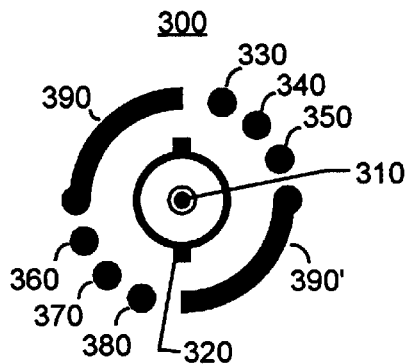
FIG. 3 is a view of a prior art connector suitable for use with the invention.

FIG. 3 shows a BNC interface connector 300 suitable for use with Level 1 and 2 robes and with probes according to the subject invention. A center conductor 310 conveys he analog signal from the probe to the oscilloscope. A ground connection 320 couples a ground reference to the probe. Surrounding the conventional BNC portion of the connector are connector landing pads for coupling additional signals. Connection pad 330 provides −15 volts, connection pad 340 provides −5 volts, and connection pad 350 provides the above-mentioned OFFSET voltage. Connection pad 360 provides the above-mentioned CLOCK signal, connection pad 370 provides +5 volts, and connection pad 380 provides +15 volts. Connection pads 390 and 390' correspond to the above mentioned DATA line and are connected together internally in the oscilloscope. The connector pads are connected to the probe BNC connector buy means of spring-loaded pins (called pogo pins) on the probe connector. While a BNC interface connector is shown, many other connector types could just as easily be used. In this regard, it is important to note that this interface has also been realized with SMA connectors and with DB style connectors.

Figure 4:
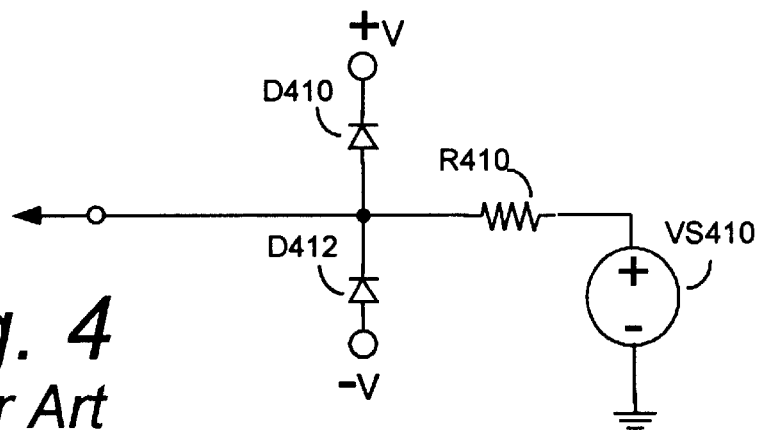
FIG. 4 is a schematic diagram of an offset voltage generation arrangement for use with a probe or accessory, as known from the prior art.

For completeness, the OFFSET voltage circuit of FIG. 4 will be described. A variable voltage source VS410 is coupled to the OFFSET line via a resistor R410. Two protection diodes D410 and D412 bypass high voltage bipolar spikes appropriate the power supply.

Figure 5:
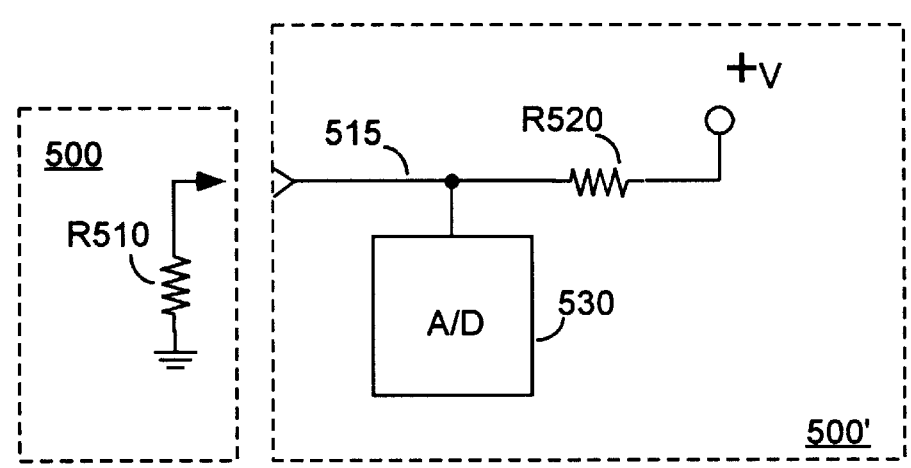
FIG. 5 is a schematic of a prior art arrangement for providing analog encoded voltage, such arrangement being useful with the subject invention.

As noted above, the basic idea of using a voltage divider to identify the scope probe type is retained in Level 3 probes and accessories, with the exception of sampling accessories. Sampling accessories are not either Level 1 or Level 2 devices, and thus there is no need to retain the above-noted voltage divider identification system. This arrangement is show in FIG. 5. A particular value of resistor R510 in probe 500 cooperates with another resistor R520 in oscilloscope 500' to set a unique voltage level on DATA line 515 to be sensed by A/D converter U530. This operation is identical to the operation of its counterpart in FIG. 2.

Figure 6:
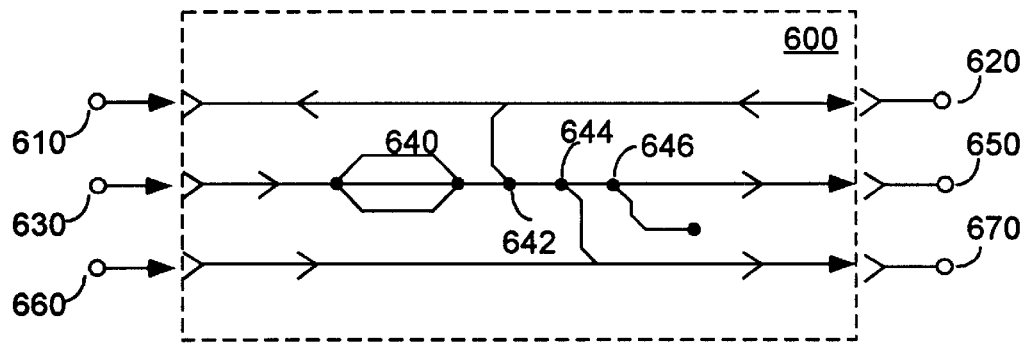
FIG. 6 is an illustration of Level 3 topology at the path level for a probe or accessory in accordance with the invention.

The signal path topology for a Level 3 probe or accessory generally designated 600 is shown in FIG. 6. Node 610 is an OFFSET CASCADE node (an output node) and node 620 is the OFFSET input (i.e., from the oscilloscope) node. Node 630 is an analog signal input terminal (usually from the device under test (DUT)). The analog signal is then applied to a PATH OPTION SWITCH 640, to an OFFSET SUMMING node 642, and through a TRIGGER PICKOFF node 644, and a POWER METER PICKOFF node 646, to an output node 650 for processing and display on the oscilloscope. Node 660 is a TRIGGER CASCADE input node, which is coupled to a TRIGGER output node 670.

Figure 7:
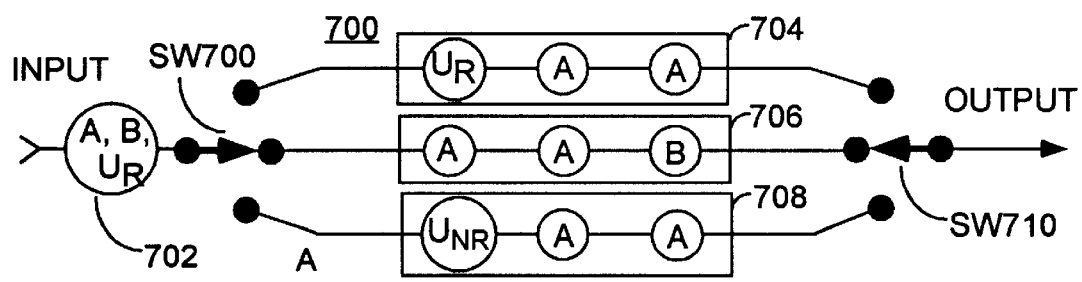
FIG. 7 is a detailed view of the path switching arrangement of FIG. 6.

PATH OPTION SWITCH 640 is shown in more detail in FIG. 7. While only three parallel paths 704, 706, 708, are shown, it is to be understood that any reasonable number of paths may actually be implemented. A switch SW700 (shown as a rotary switch for convenience) couples the analog input to one of three functional path elements 704, 706, 708. Each path presents a different transfer function to the applied analog signal. Only one of the parallel paths may be selected at any given time. A second switch SW 710 couples the signal from the selected path to the oscilloscope. Each of the paths may be controlled by certain control parameters conveyed from the oscilloscope to the probe over the I²C bus.

Switches SW700 and SW710 are shown as physical switches for convenience and ease of explanation. Preferably they are, in actual practice, logical representations of the different paths available in the topology. The actual description of how to obtain a particular path may be delegated to an element within a path. Element 702 is a representation of a REQUIRED ELEMENTS LIST. As shown, it contains information concerning three required elements A, B, and $U_R$ (an element which is unknown to the host instrument, but required). Path 704 contains element $U_R$, and is therefore unavailable for selection by the host instrument. Path 706 contains only elements which are known to the host instrument, and path 706 is therefore fully usable by the host instrument. Path 708 includes a combination of known elements and an element $U_{NR}$ that is unknown to the host instrument, but not required. Therefore, path 708 may be selected by the host instrument for use, albeit with less than full capability.

In a simple case, one switch is equivalent to a lookup table wherein each row in the table represents a path, and features are represented by entries in the columns in the table.

Figure 8:
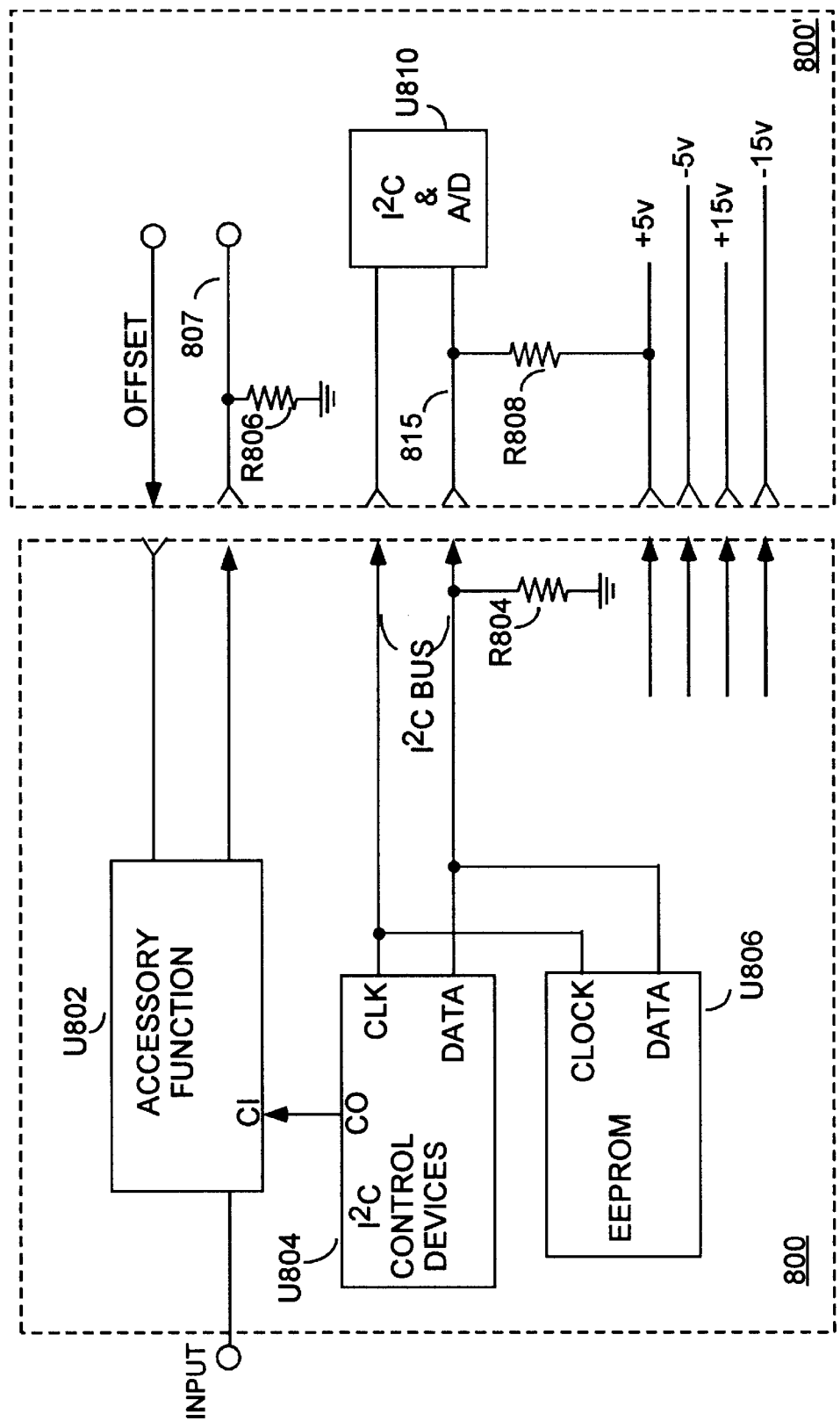
FIG. 8 is a simplified schematic diagram of a Level 3 probe in accordance with the subject invention.

A probe or accessory according to the subject invention, and generally designated 800, is shown in FIG. 8. The signal path is from the terminal marked INPUT through the Accessory Function block U802 and into the oscilloscope via signal line 807. A resistor R806 represents a termination resistance seen by the probe. An OFFSET voltage generated by a substantially equivalent to the circuit of FIG. 4 is applied to ACCESSORY FUNCTION block U802, and summed with he signal in a known fashion. Accessory Function block 802 includes the path option switch arrangement previously described with respect to FIGS. 6 and 7. Accessory Function block 802 also includes an OFFSET AMPLIFIER and an OFFSET SUMMING node substantially similar to the ones shown in FIG. 2.

The Level 3 probe of FIG. 8 includes an I$^2$C bus similar to the one used in Level 2 probes and described above with respect to FIG. 2. An EEPROM unit U806 stores probe information, such as scale factor, and probe type for transmission to an oscilloscope 800'.

Figure 10:
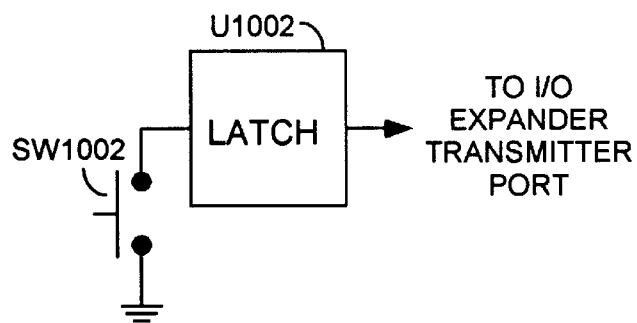
FIG. 10 is a simplified schematic diagram of a channel indicator arrangement for a Level 3 probe in accordance with the subject invention.

Unlike Level 2 probes and accessories, a Level 3 probe or accessory includes an I$^2$C CONTROL DEVICES block U804 that controls the accessory functions in ACCESSORY FUNCTION block U802 and communicates with the host instrument over the I$^2$C bus. This control is accomplished by way of a control line from a control out (CO) port of CONTROL DEVICES block 804 to a control in (CI) port of ACCESSORY FUNCTION block 802. Note that no momentary switch is provided for switching the DATA line 815 to ground reference level to accomplish the CHANNEL IDENTIFICATION function. Shorting the DATA line 815 to ground is a forbidden operation in the rules governing the use of Level 3 probes and accessories. One of the I$^2$C Control Devices in block U804 is intended to be an I/O Expander Transmitter Port. A momentary switch SW1002 is coupled through a LATCH U1002 to this I/O Expander Transmitter Port as shown in FIG. 10.

Figure 9:
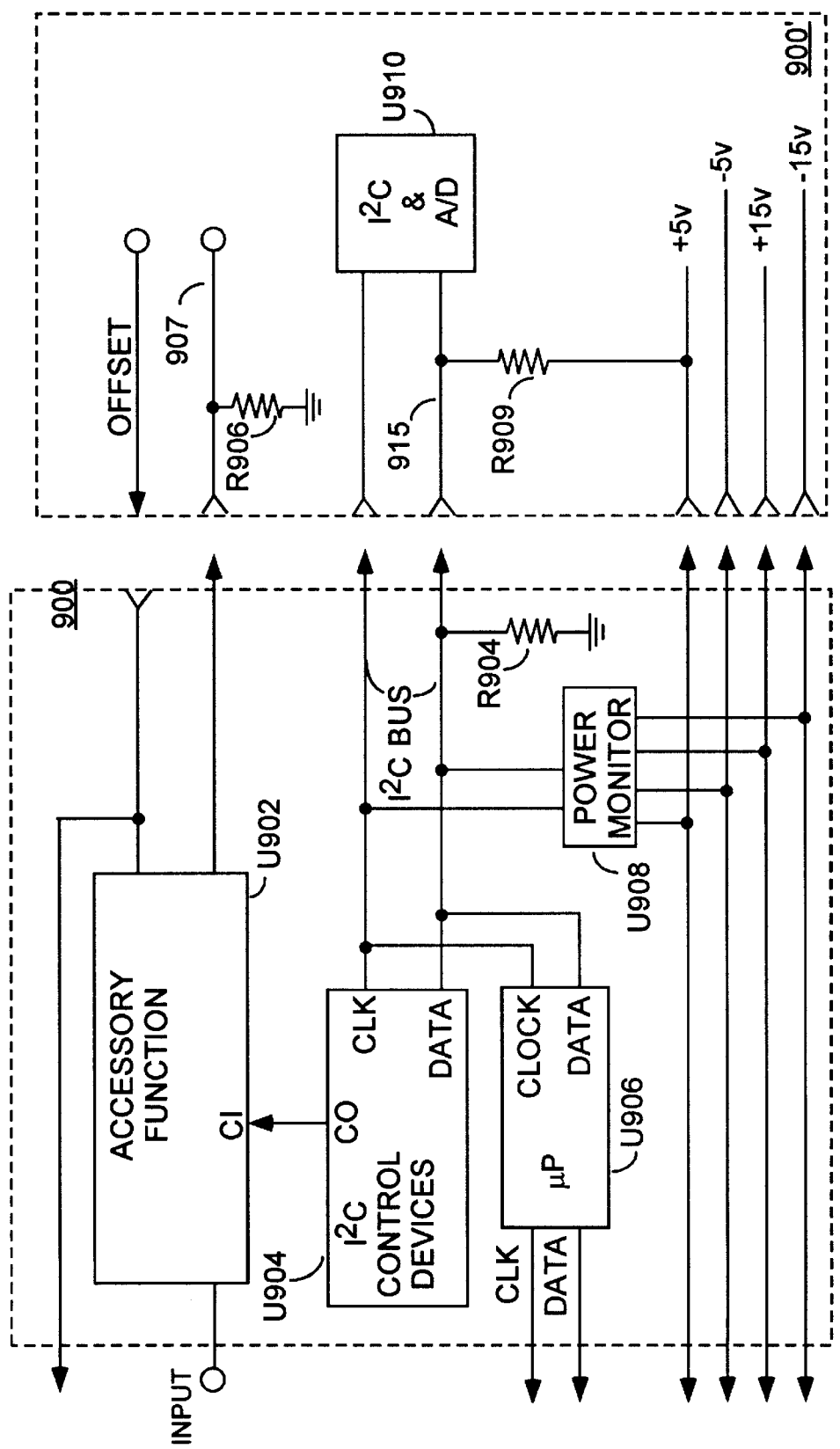
FIG. 9 is a simplified schematic diagram of a Level 3 cascade device in accordance with the subject invention.

Level 3 supports cascaded devices, comprising a probe or accessory coupled through a cascading device to an oscilloscope. Such a cascading device is shown in FIG. 9. In operation the cascading device 900 of FIG. 9 would be coupled between an oscilloscope 900' and a probe or accessory such as the example shown in FIG. 8. The cascading device 900 presents itself to the probe as if it were a host device, and presents itself to the host device (oscilloscope) as if it were a slave device (i.e., a probe or accessory). There are two differences between the apparatus of FIG. 9 and that of FIG. 8. First, the EEPROM of FIG. 8 is replaced by a microprocessor ($\mu$P) U906. One skilled in the art will understand that the use of microprocessor U906 is not necessary to the invention, but is merely a useful alternative arrangement. Second, the four power supply lines are conveyed all the way through the cascading device for use by an attached probe or accessory. By using a cascading device, one can, for example, provide for more advanced filter functions by cascading filter stages. Third, A POWER MONITOR UNIT U908 monitors the current draw from each of the power supplies and reports the facts back to the host unit (i.e., the oscilloscope) via the I$^2$C bus. This feature allows for dynamic allocation of power supply resources, by allowing the host to calculate total power dissipated based on actual current draw from each power supply rather using a predetermined fixed "worst case" value.

In operation, the subject invention allows a host system (e.g., an oscilloscope, or a cascading device) to use the capabilities of a subsystem (a probe or accessory) to the extent possible, even when the host is presented with capabilities of which it has no knowledge.

Apparatus according to the invention has the capability to communicate to the host the procedure for avoiding those portions of the subsystem that would be inoperative (or perhaps damaging) if exercised by the host. Specifically, the subject invention allows a probe having advanced features to be connected to, and used by, an oscilloscope that has no information regarding those advanced features. The oscilloscope would be able to avoid those features that it cannot exercise properly, and would be able to utilize the remaining features, without requiring a firmware upgrade.

The probe or accessory transmits information relating to its topology to the host. In the case of a probe, the topology describes a network (a directed graph) connecting elements (i.e., features) from probe tip to instrument connector. Only one path from probe tip to connector may be active at any one time. Each feature is described by a unique number called a "tag". Level 3 defines a list of available features. New tags may be added to this list of available features, as long as existing tag numbers are not disturbed. Some of the available features are: "Scale", "Bandwidth_Limiter", "Coupling", and "Hardware_Register_Value". An Important item transmitted from the probe to the host is a list of "Required Tags". The required tags are tags that must be "understood" in order to exercise a particular feature. In this case the word "understood" means that the host has stored information concerning that feature. If the host does not understand the tag, then the host is forbidden to use any path of the topology of the probe that includes that tag. Accordingly, the host instrument deletes information relating to topology paths, which it cannot use. For example, if the host instrument did not know how to control a "TDR_Step_Generator", then the instrument would avoid any paths where one was described (i.e., paths associated with that particular tag). As another example, a host instrument would avoid a static sensitive low capacitance path, if the host instrument could not control such a path properly. It is important to note that one of the switch paths defined by PATH_OPTION_SWITCH may couple to "OFF", or "CALIBRATOR SIGNAL". That is, not all of the paths couple a signal all of the way through the probe or accessory to the host instrument. For example, a selection could also control an LED "ON" path, which does not convey a signal to the host instrument, but nevertheless serves a useful purpose at the probe.

The host instrument is then free to use any remaining network paths in the probe. In a simple case, an external bandwidth limit filter accessory could have two paths, "Straight Through" and "Bandwidth Limit". An instrument that understands how to control bandwidth limiting can activate that path when needed. An instrument that does not understand how to control bandwidth limiting can still be used to convey the signal straight through the accessory and also employ other features that it does understand.

If the host instrument encounters a tag that it does not understand, and which does not appear in the list of required tags, the host instrument is free to ignore that tag. This is acceptable because that tag is not "required". The host instrument will behave as if that tag was a "no-operation" (i.e., "no-op") tag. This aspect of the invention allows the inclusion of extra features in the probe which are capable of being used by an instrument, without requiring all instruments to use that information. For example, if a host instrument did not know how to use a "Noise_Figure" feature, the probe could still be used, albeit perhaps with lesser performance.

Referring again to FIG. 6, there are four externally available nodes of concern to a sampling Level 3 end accessory. These are OFFSET 620, INPUT 630, OUTPUT 650, and TRIGGER 670. Two other nodes which pertain only to cascade devices are OFFSET CASCADE 610 and TRIGGER CASCADE 660. A path is defined as a continuous connection between a specified input node (INPUT or OFFSET) and an output node (OUTPUT or TRIGGER). In the case of a POWER METER branch only, there is not output node because the path must end internally at an A/D converter (not shown) coupled to the $I^2C$ bus. With two input nodes and two output nodes there are only four possible configurations within an end accessory. The three useful configurations are: CHANNEL PATH (INPUT node to OUTPUT node), TRIGGER PATH (INPUT node to TRIGGER node) via the TRIGGER PICKOFF node 644, and OFFSET PATH (OFFSET node to OUTPUT Node) via OFFSET SUMMING node 642. The remaining configuration (OFFSET to TRIGGER) is not considered very-useful. There is however, a fourth useful configuration when one considers INPUT to POWER METER PICKOFF node 646.

Referring again to FIG. 7, the Channel Path Switch option element is a path that also provides information on topological control by defining choices for each of several alternate Channel Paths. The Channel Path Switch Option is defined in Table 1 below.

TABLE 1

| OPTION | |
|---|---|
| Name | PATH_SWITCH |
| Usage | PATH_SWITCH(3, |
| | {8,SCALE(1),IO_EXP_PORT_SETTING(0X00)} |
| | {8,SCALE(0.1),IO_EXP_PORT_SETTING(0x01)} |
| | {14,SCALE(0.01),coupling(DC), |
| | IO_EXPANDER_SETTING(0x40,0x01,0x01), |
| | WAIT(3)} |
| | ) |
| Tag | 0x22 |
| Version | 3.00 |
| Function | Defines parallel options for Channel Path topology; sets up parallel branches and control |
| Parameter 1 | Number of Branches |
| | NumBranches: =<u_int> |
| Parameter 2 | Size of elements for all bytes in branch 1 |
| | <branch1Element Size>:=sizeof(<branch1ElementSize>) |
| | + sizeof (<branch1Specification>:=u_int> |
| | Branch1 specification |
| | <branch1Specification>:= {elements} |
| Parameter 3 | Size of elements for all bytes in branch 2 |
| | <branch2Element Size>:=sizeof(<branch2ElementSize>) |
| | + sizeof (<branch2Specification>:=u_int> |
| | Branch2 specification |
| | <branch2Specification>:= {elements} |

Each Channel Path branch begins at the point of the PATH_SWITCH specification and ends at the termination of the last branch. A branch may contain any element normally available for Channel Paths, as well as several types of $I^2C$ control specifications appropriate to the proper setup of apparatus for that branch. These include IO_EXPANDER SETTING (I/O expander receiver pins at a single I/O expander address), DAC_SETTING (digital to analog converter settings), POT_SETTING (potentiometer settings), and PATH_SETTLING_TIME (wait for settling after operations are completed). The specification of each branch must follow its element in consecutive fashion. A size parameter is provided to mark the length of each branch.

Note that PATH_SWITCH defines the branches, and the means to execute the branch setup, only. Selection of a particular branch is handled through other elements outside of the Channel Path option element (e.g. the description of how to make a particular selection may be nested within a branch of the Patch Switch).

The $I^2C$ control specifications listed above would normally be executed once at initialization if encountered outside of the Channel Path option element. When inside, execution occurs only when the path option is selected and every time the path option is selected. Channel Path option elements may be nested, with no maximum nesting level specified. The default branch at power-up will be set to branch 0 unless otherwise specified through the use of initialization $I^2C$ control specifications.

A Change Path Branch Procedure is initiated by a host instrument, when the host instrument want to change to an alternate branch specified in PATH_SWITCH. The following are requirements for this procedure. Execute the settings for the I/O expander receiver pins at a single I/O expander address (I/O_EXPANDER_SETTING), DAC settings (DAC-SETTING, and pot settings (POT_SETTINGS) for the path branch selected, and the wait settling time procedure must be called if the WAIT element is designated in the branch chosen.

The above-mentioned list of required tags is shown below in table 2 as a feature called ELEMENTS_REQUIRING_SUPPORT.

TABLE 2

| OPTION | |
|---|---|
| Name | ELEMENTS_REQUIRING_SUPPORT |
| Usage | ELEMENTS_REQUIRING_SUPPORT (SAMPLING, HEAD, SACALW, I/O_PORT_SETTING) |
| Tag | 0x03 |
| Version | 3.00 |
| Function | Specifies the minimum required elements that a host must understand to use a Channel Path |
| Parameter 1 | Element required, listed by tag |
| | <reqElement>:=<tag> |
| Parameter 2 | Element required, listed by tag |
| | <reqElement>:=<tag> |

The ELEMENTS_REQUIRING_SUPPORT feature allows a host that does not have an up-to-date firmware revision to ascertain whether the use of an accessory, or a Channel Path within an accessory, should be attempted. If the host instrument cannot understand the listed elements, the host must not attempt to operate the Channel Path. Several ELEMENTS_REQUIRING_SUPPORT may be used in a single message.

There is a significant benefit to the use of the subject invention from the point of view of probe designers and manufacturers. Heretofore, there has been a difficult-to-resolve "chicken and egg" coordination problem involving the production of oscilloscopes having new features and probes having new features. That is, which does the manufacturer design, produce, and ship first, the advanced probe, or the advanced oscilloscope. The subject invention solves the problem by allowing current Level 3 oscilloscopes to use the currently-understood features of more advanced probes that may be introduced at some later time in the future. Note that the "new" (i.e., not understood) features would still not be available to the current oscilloscope, but the remainder of the probe would still be useful. Therefore, there would be a market for the new probes having Level 3 capability, even before oscilloscopes having more advanced features become available.

The term "controller" as used herein is intended to include microprocessors, microcomputers, ASICs, and dedicated hardware controllers. While the host instrument has been described as an oscilloscope, the invention is equally applicable to other forms of test and measurement equipment such as, Logic Analyzers, Spectrum Analyzers, and the like, and such instruments are felt to lie within the scope of the following claims.

What is claimed is:

1. A probe for an oscilloscope, comprising:

an input for receiving a signal and an output coupled to oscilloscope;

at least one signal path for conveying a signal from said input to said output;

a data path for communicating between said oscilloscope and said probe;

a memory unit for storing information about said probe, said memory unit being coupled to said data path;

said information including an entry concerning a function that said oscilloscope is required to be capable of controlling; and said memory unit retrieving said entry under control of said oscilloscope and conveying said entry to said oscilloscope via said data path for a determination by said oscilloscope as to whether or not said oscilloscope can control said function; wherein said probe includes a path option switch for selecting one of a plurality of paths through said probe;

each of said paths being associated with a different function;

each of said different functions having a corresponding different entry in said memory unit; wherein upon said determination that a signal path contains an unknown required function incapable of being controlled by said oscilloscope, a path containing said required function will not be selected by said oscilloscope for operation; and wherein upon a determination that a signal path does not contain an unknown required function incapable of being controlled by said oscilloscope, but does contain an unknown but not required function which said oscilloscope cannot control but which is not required, said path is made available for selection by said oscilloscope.

2. An accessory for a test and measurement instrument, comprising:

an input for receiving a signal and an output coupled to said test and measurement instrument;

at least one signal path for conveying a signal from said input to said output;

a data path for communicating between said test and measurement instrument and said accessory;

a memory unit for storing information about said accessory, said memory unit being coupled to said data path;

said information including an entry concerning a function that said test and measurement instrument is required to be capable of controlling; and said memory unit retrieving said entry under control of said test and measurement instrument and conveying said entry to said test and measurement instrument via said data path for a determination by said test and measurement instrument as to whether or not said test and measurement instrument can control said function; wherein said accessory is a cascading accessory for connection between a probe and said test and measurement instrument;

said cascading accessory coupling signal, control, and power supply connections from said test and measurement instrument to said probe.

3. The accessory of claim 2, wherein:

said cascading accessory includes a power monitor unit coupled to said power supply connections and to said data path for monitoring power usage and reporting power usage information to said test and measurement instrument.

4. The accessory of claim 2, wherein:

upon said determination that a signal path contains an unknown required function incapable of being controlled by said test and measurement instrument, a path containing said required function will not be selected by said test and measurement instrument for operation, and wherein:

upon a determination that a signal path does not contain an unknown required function incapable of being controlled by said test and measurement instrument, but does contain an unknown but not required function which said test and measurement instrument cannot control but which is not required, said path is made available for selection by said test and measurement instrument.

* * * * *